United States Patent
Watamura (10) Patent No.: US 6,958,802 B2
(45) Date of Patent: Oct. 25, 2005

(54) DISPLAY DEVICE HAVING ISLAND-SHAPED CONDUCTOR FOR REPAIRING LINE DISCONNECTION

(75) Inventor: Shigeki Watamura, Kikuchi-gun (JP)

(73) Assignee: Advanced Display Inc., Kikuchi-gun (JP)

( * ) Notice: Subject to any disclaimer, the term of this patent is extended or adjusted under 35 U.S.C. 154(b) by 14 days.

(21) Appl. No.: 10/617,662

(22) Filed: Jul. 14, 2003

(65) Prior Publication Data

US 2004/0016925 A1 Jan. 29, 2004

(30) Foreign Application Priority Data

Jul. 23, 2002 (JP) ........................................ 2002-213335

(51) Int. Cl.[7] .......................... G02F 1/13; G02F 1/1333; G02F 1/136; H01L 29/04
(52) U.S. Cl. .......................... 349/192; 349/40; 349/43; 349/138; 257/59
(58) Field of Search .............................. 349/40, 42, 43, 349/138, 192; 257/59, 72

(56) References Cited

U.S. PATENT DOCUMENTS

| 5,969,779 | A | | 10/1999 | Kim et al. ..................... 349/54 |
|---|---|---|---|---|
| 5,977,563 | A | * | 11/1999 | Kubo et al. ..................... 257/72 |
| 5,995,178 | A | * | 11/1999 | Fujikawa et al. .............. 349/55 |
| 6,025,892 | A | * | 2/2000 | Kawai et al. .................. 349/43 |
| 6,072,559 | A | * | 6/2000 | Kanemori et al. ........... 349/192 |
| 6,621,535 | B1 | * | 9/2003 | Fukada ......................... 349/40 |
| 6,630,976 | B2 | * | 10/2003 | Ahn et al. ..................... 349/139 |
| 2001/0013910 | A1 | | 8/2001 | Ahn et al. ..................... 349/54 |
| 2002/0047977 | A1 | | 4/2002 | Lee ............................. 349/141 |
| 2002/0050967 | A1 | | 5/2002 | Hashimoto et al. ........... 345/87 |

FOREIGN PATENT DOCUMENTS

| EP | 0 373 586 | 6/1990 |
|---|---|---|
| JP | 9-113930 | 5/1997 |

* cited by examiner

*Primary Examiner*—Tarifur R. Chowdhury
(74) *Attorney, Agent, or Firm*—Oblon, Spivak, McClelland, Maier & Neustadt, P.C.

(57) ABSTRACT

A liquid crystal display device has a gate line formed on a substrate, and a gate insulating film deposited thereon. On the gate insulating film are provided a source line, and a conductive layer above the gate line. An insulating layer is formed thereon, and a pixel electrode is then provided. The conductive layer does not contact the source line, and at least two portions of the conductive layer are electrically connected with the gate line.

4 Claims, 8 Drawing Sheets

Background Art

FIG. 11

Background Art

DISPLAY DEVICE HAVING ISLAND-SHAPED CONDUCTOR FOR REPAIRING LINE DISCONNECTION

BACKGROUND OF THE INVENTION

1. Field of the Invention

The present invention relates to a method for repairing line disconnection of a display device and a display device capable of repairing line disconnection, which are particularly suitable for application to a liquid crystal display device.

2. Related Background Art

A liquid crystal display device is provided with a matrix of number of signal lines and pixel electrodes. As the number of signal lines is on the increase because of the recent trend of larger and higher resolution liquid crystal display devices, the problem of line disconnection can occur more often. Line disconnection occurs due to pinholes and dust in the manufacturing process. In the event of disconnection, a proper voltage is not applied to a pixel electrode corresponding to a disconnected line, causing line defects and other display problems to produce a defective product. Therefore, a method for repairing line disconnection using a laser is now under research and development.

Figure 7:
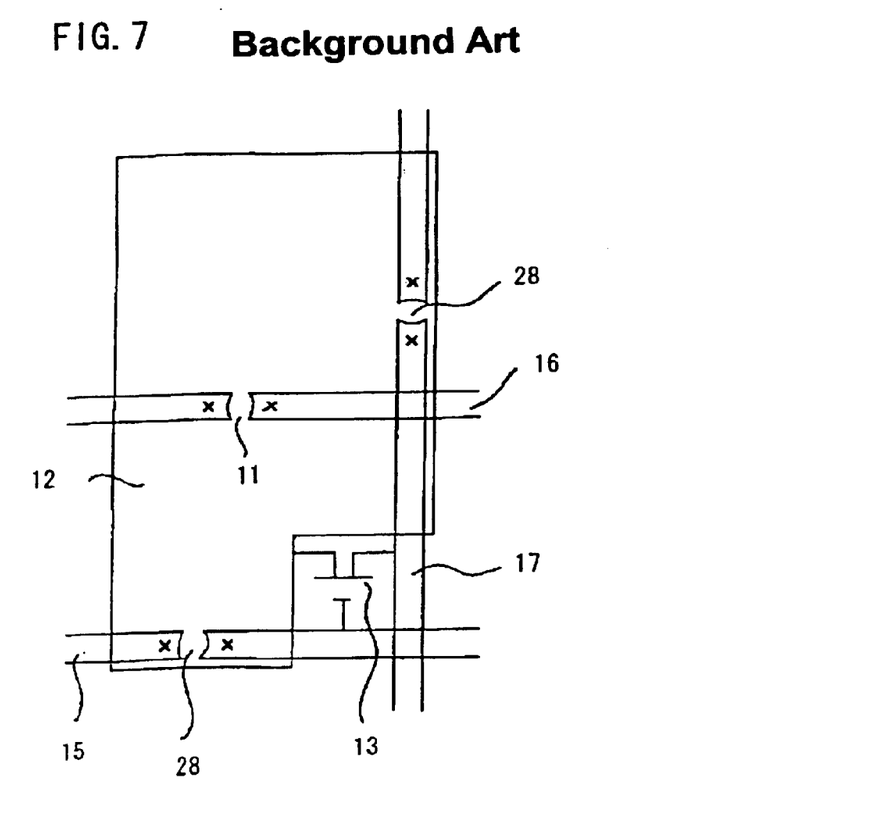
FIG. 7 is a plan view showing a structure of one pixel area of a conventional liquid crystal display device.

FIG. 7 shows a configuration of a conventional active matrix liquid crystal display device. FIG. 7 is a plan view showing a structure of one pixel area of the liquid crystal display device. Reference numeral 12 designates a pixel electrode, 13 a thin film transistor (TFT), 15 a gate line, 16 a storage capacitor line, 17 a source line, and 28 a disconnected portion.

The active matrix liquid crystal display device shown in FIG. 7 is provided with a matrix of plurality of the pixel electrodes 12, each of which is connected with the TFT 13 that is a switching element. The gate electrode of the TFT 13 is connected with the gate line 15, and gate signals input to the gate electrode control and drive the TFT 13. The source electrode of the TFT 13 is connected with the source line 17, and data (display) signals are input to the pixel electrode 12 through the TFT 13 when the TFT 13 is selected. The gate line 15 and the source line 17 cross each other at right angles, surrounding the pixel electrode 12. The drain electrode of the TFT 13 is connected with the pixel electrode 12.

Figure 8A:
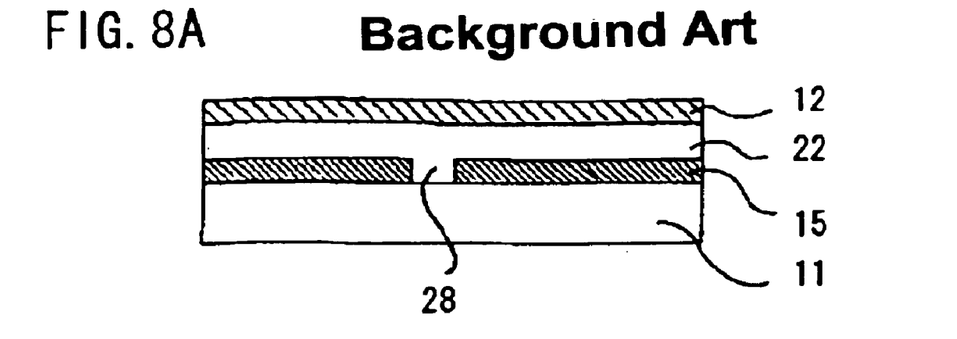
FIGS. 8A and 8B are sectional views showing structures of a disconnected portion of a gate line in the conventional liquid crystal display device.

A method for repairing signal line disconnection is described in Japanese Patent Application Laid-Open No. H09-113930, for example. The method according to the first embodiment of the above prior art will be explained hereinbelow. FIG. 8A shows a structure of a cross-section of a disconnected portion of a gate line. The same reference numerals as those in FIG. 7 designate the same elements, and redundant description will be omitted. Reference numeral 11 designates a substrate, 22 a gate insulating film, and 29 a molten metal.

As shown in FIG. 7, the pixel electrode 12 is arranged to partially overlap the-gate line 15. They are electrically isolated by the gate insulating film 22 to enlarge the area of the pixel electrode 12, that is, to increase the aperture ratio. Also, an additional capacitor is formed by placing the gate insulation film 22 between the pixel electrode 12 and the gate line 15.

Figure 8B:
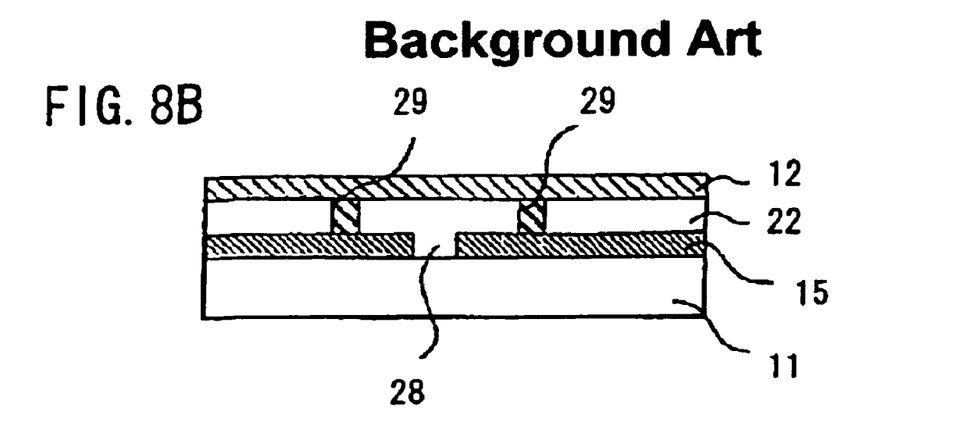

As shown in FIG. 7, there are cross marks on both outsides of the disconnected portion 28 of the gate line 15. A laser is applied to the marks. The gate line 15 or the pixel electrode 12 is molten to produce the molten metal 29 as shown in FIG. 8B. A bypass route through the gate line 15, the molten metal 29, the pixel electrode 12, the molten metal 29, and the gate line 15 is thereby created; therefore, the disconnection is repaired. Disconnection of the source line 17 and the storage capacitor line 16 is also repaired in the same way.

Figure 9:
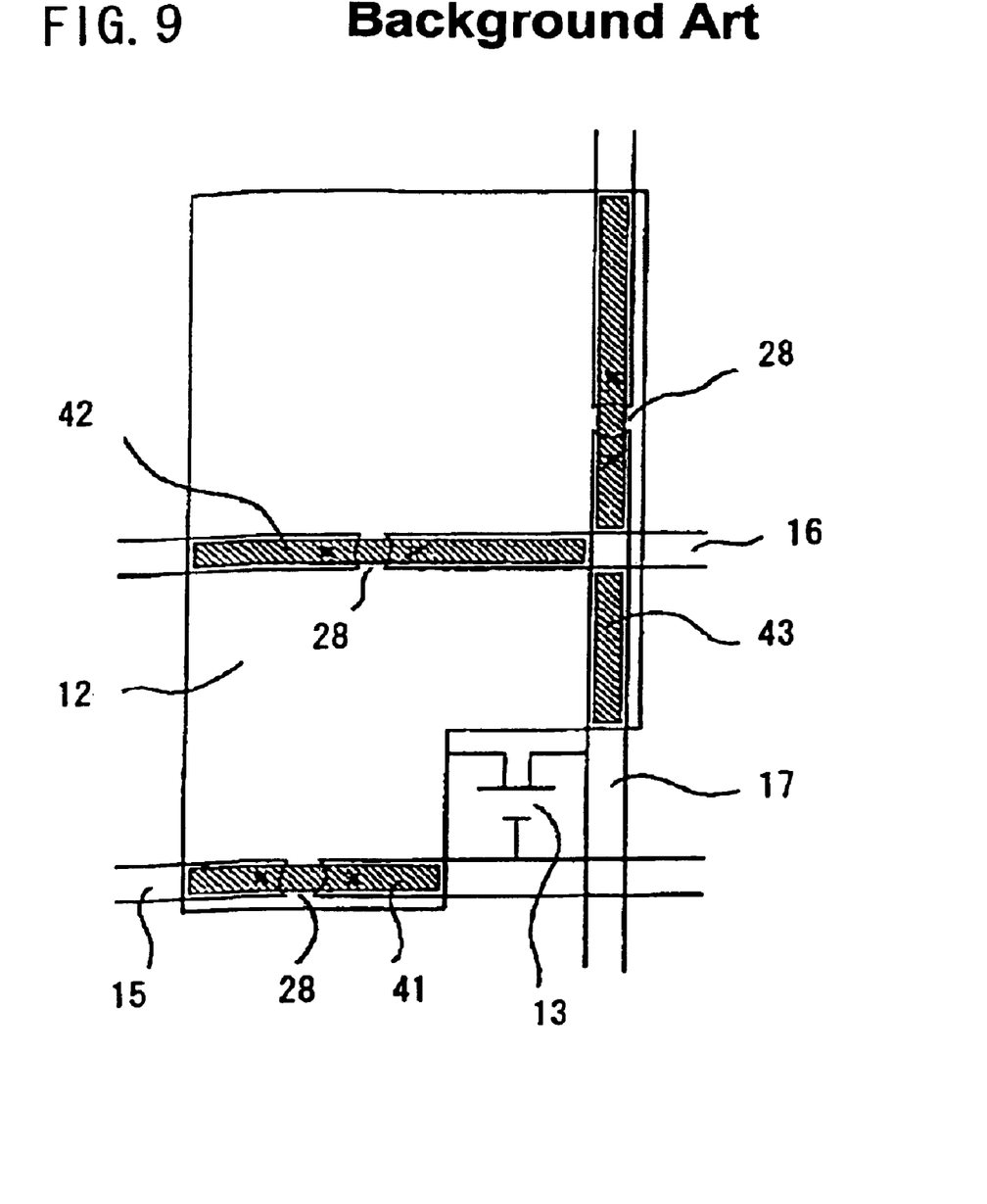
FIG. 9 is a plan view showing a structure of one pixel area of a conventional liquid crystal display device.
Figure 10A:
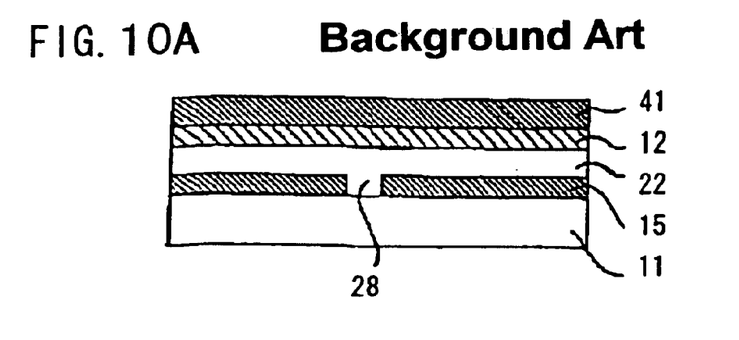
FIGS. 10A and 10B are sectional views showing structures of a disconnected portion of a gate line in the conventional liquid crystal display device.
Figure 10B:
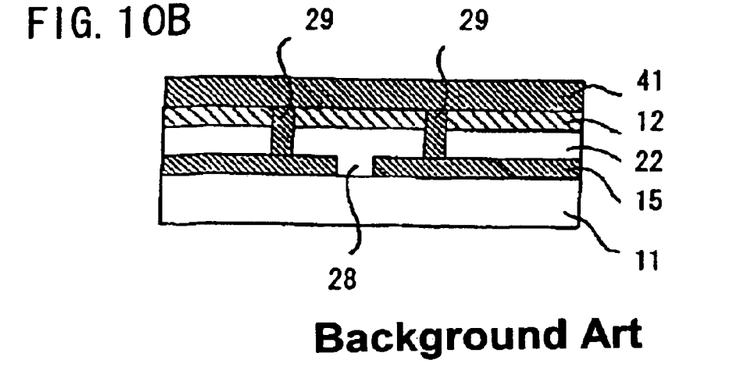

FIGS. 9 and 10 show a structure of one pixel area of the liquid crystal display device where disconnection is repaired according to the second embodiment of the invention disclosed in Japanese Patent Application Laid-Open No. H09-113930. FIG. 9 is a plan view of a structure of one pixel area where disconnection is repaired, and FIG. 10 is a sectional view thereof. The same reference numerals as those in FIGS. 7 and 8 designate the same elements, and redundant description will be omitted. Reference numeral 41 designates a conductive layer for repairing gate line disconnection, 42 a conductive layer for repairing storage capacitor line disconnection, and 43 a conductive layer for repairing source line disconnection.

As shown in FIGS. 9 and 10A, the pixel electrode 12 partially overlaps the gate line 15 with the insulating film interposed therebetween. On the part of the pixel electrode 12 overlapping the gate line 15 is formed a conductive metal layer. The conductive metal layer provided for repairing disconnection of the gate line 15 will be referred to hereinafter as a conductive layer 41. Similarly, conductive metal layers for repairing disconnection of the source line 17 and the storage capacitor line 16 will be referred to as a conductive layer 42 and a conductive layer 43, respectively.

In the following, a description will be given on the case where the gate line 15 is disconnected. As shown in FIGS. 9 and 10A, on the insulating substrate 11 are formed the gate line 15 and the storage capacitor line 16. The gate insulating film 22 is formed thereon. Next, the source line 17, the TFT 13, and an insulating layer are formed. Then, the pixel electrode 12 is formed. Further, the conductive layer 41 for repairing gate line disconnection is formed. The conductive layer 41 is provided on the area where the pixel electrode 12 overlaps the gate line 15 with the gate insulating film 22 interposed therebetween. The conductive layer 41 is formed in an island shape above the gate line 15 except the crossing with the source line 17.

Disconnection of the gate line 15, the storage capacitor line 16, and the source line 17 occurs due to pinholes and dust in the manufacturing process. If the disconnection occurs, no drive signal is given to the pixel, thus disabling display.

The case where disconnection occurs at the disconnected portion 28 of the gate line 15 of an active matrix liquid crystal display device will be explained hereinbelow. A laser is applied to the positions at both outsides of the disconnected portion 28 (the positions shown by the cross marks in FIG. 9) through the conductive layer 41. The molten metal 29 produced by the laser application electrically connects the conductive layer 41 and the gate line 15. The disconnected gate line 15 regains continuity by a bypass line through the molten metal 29, the conductive layer 41, and the molten metal 29. It is therefore possible to apply drive signals to the gate line where no signal has been given.

Figure 11:
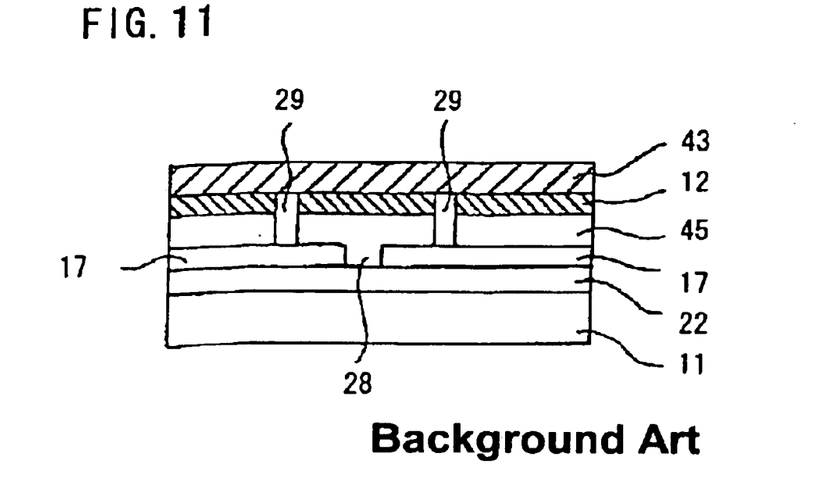
FIG. 11 is a sectional view showing a structure of a disconnected portion of a source line in the conventional liquid crystal display device.

Disconnection of the source line 17 can be also repaired in the same way as shown in FIG. 11. Further, the storage capacitor line 16 can be repaired in the same manner.

The above conventional technique, however, has the following problems. In the first embodiment of the invention disclosed in Japanese Patent Application Laid-Open No. H09-113930, the connection resistance of the pixel electrode 12 and the molten metal 29 can be high. The pixel electrode 12 is formed by Indium Tin Oxide (ITO), and the connection resistance with chromium, tantalum, titanium, and molybdenum used for the gate line 15 and the storage capacitor line 16 significantly differs depending on conditions of film deposition and film surface. There is a case where the connection resistance reaches several megohms, which results in decrease in the rate of successful repair. Use of aluminum for the gate line 15 is especially problematic since the connection resistance of an aluminum element and ITO used for the pixel electrode 12 is extremely high. Therefore, when a laser is applied to connect them, the connection electrical resistance almost reaches one megohm, which is above the limit of the connection resistance for repairing disconnection. Besides, the application of a laser to the pixel electrode 12 causes the ITO to be peeled off and a fragment of the ITO is stuck in between a counter electrode and the pixel electrode to trigger unexpected short-circuit.

The repair method described in the second embodiment of the invention disclosed in Japanese Patent Application Laid-Open No. H09-113930 also has problems. According to the method, the conductive layer for repairing line disconnection is additionally provided on the pixel electrode 12. Therefore, the manufacturing process requires an additional step of forming the conductive layer. Also, the conductive layer is placed on the pixel electrode applying an electric field to liquid crystals. Therefore, after the repair, an electric potential of a source signal, gate signal, or common signal is directly applied to the liquid crystals through the conductive layer. It causes noise to have an adverse effect on operations of the liquid crystals, resulting in poor display quality.

As described above, the conventional method for repairing line disconnection has the problems of a reduced rate of successful repair and deteriorated display quality caused by an expected short-circuit and noise.

SUMMARY OF THE INVENTION

The present invention has been accomplished to solve the above problems and an object of the present invention is thus to provide a display device capable of repairing line disconnection without decreasing display quality, and the repair method.

A display device according to the present invention is a display device having a plurality of pixels, including a substrate; a conductive line provided on the substrate; a first insulating layer provided on the conductive line; an island-shaped conductor for repairing line disconnection, provided above the conductive line with the first insulating layer interposed therebetween; a switching element controlling a signal to a pixel; a second insulating layer with a through hole, provided on the switching element and the island-shaped conductor; and a pixel electrode provided above the switching element with the second insulating layer interposed therebetween and connected with the switching element via the through hole. In this configuration, the display device is capable of repairing line disconnection without decreasing display quality.

In the above display device, the conductive line can be a gate line transmitting a control signal to the switching element.

The above display device can also include a source line provided in the same layer as the island-shaped conductor.

In the display device, the conductive line can be a storage capacitor line forming a storage capacitor with the pixel electrode.

The above display device can also include a source line provided in the same layer as the island-shaped conductor.

It is also possible in the display device that a plurality of island-shaped conductors are provided above the conductive line.

It is preferable in the display device that at least two portions of the island-shaped conductor are connected to the conductive line.

In the display device, the island-shaped conductor and the conductive line can be connected by laser application.

Another display device according to the present invention is a display device having a plurality of pixels, including a substrate; a first insulating layer provided on the substrate; a conductive line provided on the first insulating layer; an island-shaped conductor for repairing line disconnection, provided below the conductive line with the first insulating layer interposed therebetween; a switching element controlling a signal to a pixel; a second insulating layer with a through hole, provided on the switching element and the conductive line; and a pixel electrode provided above the switching element with the second insulating layer interposed therebetween and connected with the switching element via the through hole. In this configuration, the display device is capable of repairing line disconnection without decreasing display quality.

In the above display device, the conductive line can be a source line transmitting a display signal to the switching element.

It is also possible in the display device that a plurality of island-shaped conductors are provided above the conductive line.

It is preferable in the display device that at least two portions of the island-shaped conductor are connected to the conductive line.

The display device can also include a gate line provided in the same layer as the island-shaped conductor, the gate line transmitting a control signal to the switching element.

The above display device can also include an island-shaped conductor for repairing gate line disconnection provided in the same layer as the source line, above the gate line.

The display device can also include a gate line and a storage capacitor line provided in the same layer as the island-shaped conductor, the gate line transmitting a control signal to the switching element, and the storage capacitor line forming a storage capacitor with the pixel electrode.

The above display device can also include an island-shaped conductor for repairing gate line disconnection provided in the same layer as the source line, above the gate line; and an island-shaped conductor for repairing storage capacitor line disconnection provided in the same layer as the source line, above the storage capacitor line.

A method for repairing a display device having a plurality of pixels according to the present invention is a method including a step of preparing a display device, the display device having a substrate, a conductive line layer provided on the substrate, an island-shaped conductor for repairing line disconnection, the island-shaped conductor overlapping with the conductive line layer, a first insulating layer provided between the island-shaped conductor and the conductive line layer, a switching element controlling a signal to a pixel, a second insulating layer with a through hole, provided on the switching element, and a pixel electrode provided above the switching element and the island-shaped conductor with the second insulating layer interposed therebetween and connected with the switching element via the through hole; a step of applying a laser to two points across a disconnected portion of the conductive line layer; and a step of connecting the island-shaped conductor and the conductive line layer at the two points by applying a laser. This method is capable of repairing line disconnection of the display device without decreasing display quality.

In the above method, the island-shaped conductor can be provided above the conductive line layer.

In the method, on the other hand, the island-shaped conductor can be provided below the conductive line layer.

In the step of applying a laser in the above method, the laser can be applied from the side of the substrate.

The present invention will become more fully understood from the detailed description given hereinbelow and the accompanying drawings which are given by way of illustration only, and thus are not to be considered as limiting the present invention.

DESCRIPTION OF THE PREFERRED EMBODIMENTS

First Embodiment

Figure 1:
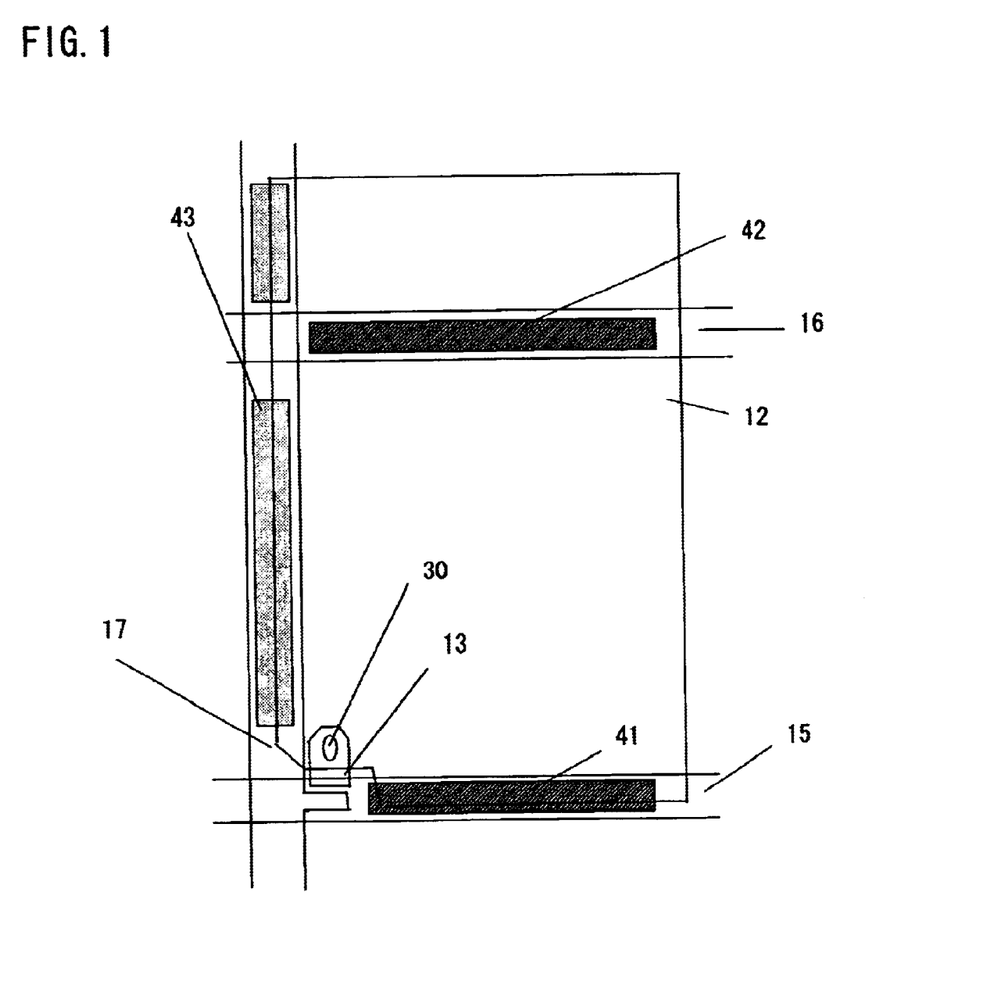
FIG. 1 is a plan view showing a structure of one pixel area of a liquid crystal display device according to the first embodiment of the present invention.
Figure 2:
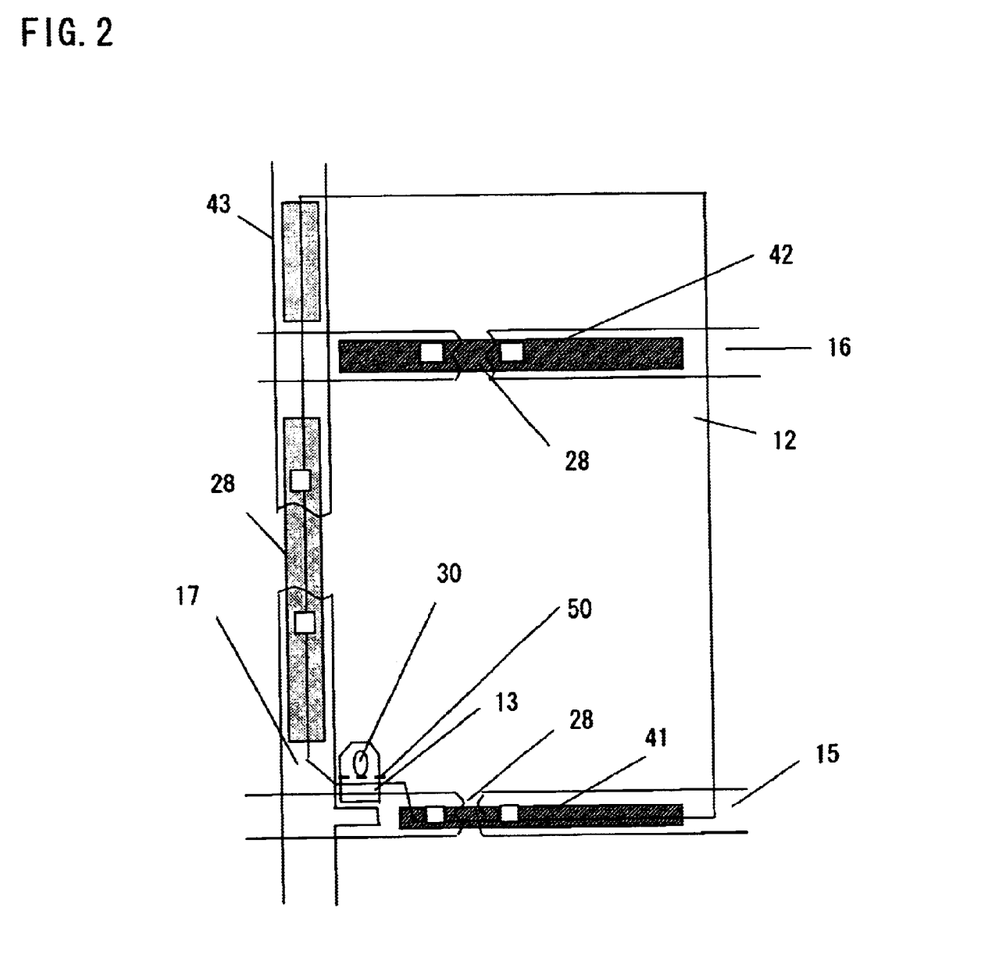
FIG. 2 is a plan view showing a structure of one pixel area of the liquid crystal display device according to the first embodiment of the present invention, where line disconnection occurs.
Figure 3A:
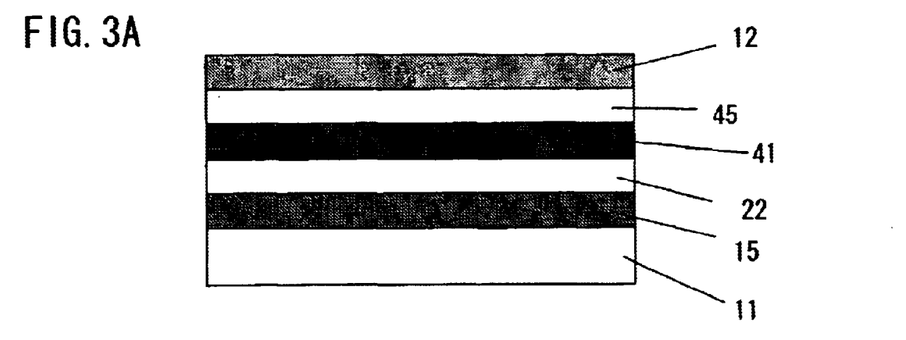
FIGS. 3A, 3B, and 3C are sectional views showing structures of a disconnected portion of a gate line in the liquid crystal display device according to the first embodiment of the present invention.
Figure 4:
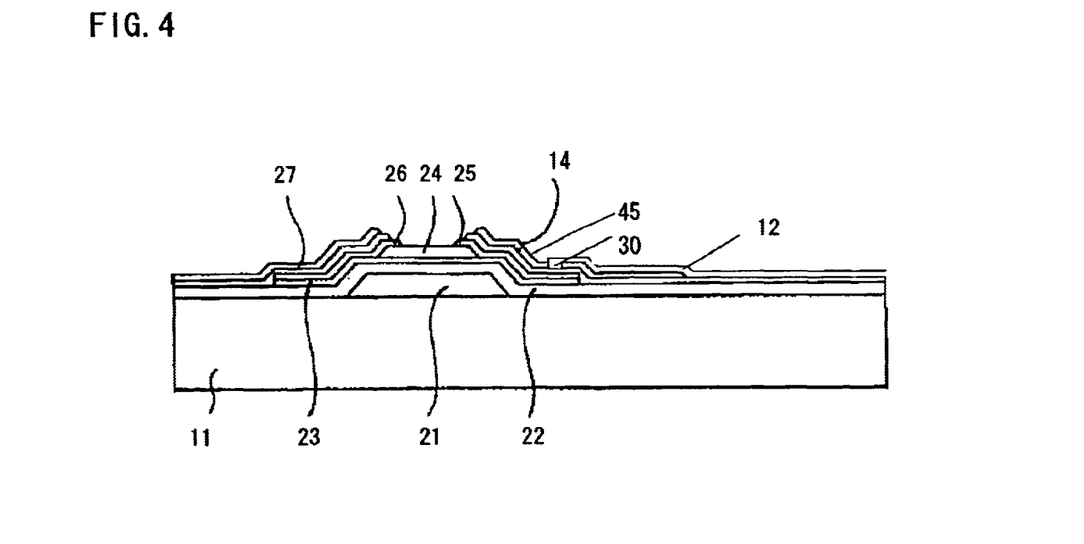
FIG. 4 is a sectional view showing a structure of a TFT area of the liquid crystal display device according to the first embodiment of the present invention.

A method for repairing line disconnection according to the present invention will be explained hereinafter with reference to FIGS. 1 to 4. FIG. 1 is a plan view showing a structure of one pixel area of an active matrix liquid crystal display device according to the present invention. FIG. 2 is a plan view showing a structure of the pixel area where each of a gate line, source line, and storage capacitor line has a disconnected portion 28. FIG. 3A is a sectional view showing a structure of the disconnected portion of the gate line. FIG. 4 is a sectional view showing a structure of a TFT area of the active matrix liquid crystal display device. Reference numeral 11 designates a substrate, 12 a pixel electrode, 13 a thin film transistor (TFT), 14 a drain electrode, 15 a gate line, 16 a storage capacitor line, 17 a source line, 21 a gate electrode, 22 a gate insulating film, 23 a silicon semiconductor layer, 24 an etching stopper, 25 the first n$^+$ silicon layer, 26 the second n$^+$ silicon layer, 27 a source electrode, 28 a disconnected portion, 29 a molten metal, 30 a contact hole, 41 a conductive layer for repairing gate line disconnection, 42 a conductive layer for repairing storage capacitor line disconnection, and 43 a conductive layer for repairing source line disconnection.

As shown in FIG. 1, the pixel electrode 12 is connected with the TFT 13 that is a switching element. The gate electrode 21 of the TFT 13 is connected with the gate line 15, and gate signals input to the gate electrode 21 drives and controls the TFT 13. The source electrode 27 of the TFT 13 is connected with the source line 17, and data (display) signals are input to the drain electrode 14 shown in FIG. 4 through the TFT 13 when the TFT 13 is selected. From the drain electrode 14, the data signals are input to the pixel electrode 12 through the contact hole 30. The gate line 15 and the source line 17 cross each other at right angles, surrounding the pixel electrode 12. The drain electrode 14 of the TFT 13 is connected with the pixel electrode 12. The conductive layer 41, the conductive layer 43, and the conductive layer 42 are provided for the gate line 15, the source line 17, and the storage capacitor line 16, respectively. The conductive layers are island shaped or electrically floating.

FIG. 2 shows the case where each of the three lines has the disconnected portion 28. Repair of the disconnection will be explained hereinafter with reference to FIG. 3. The explanation will be given on the repair of the gate line 15. FIG. 3A shows a structure of a cross-section of the disconnected portion of the gate line in one pixel area of an active matrix liquid crystal display device. On the substrate 11 as the bottom layer are provided the gate line 15, the gate insulating film 22, the conductive layer 41, the insulating film 45, and the pixel electrode 12 as the top layer. For example, on the insulating substrate 11 such as a glass substrate, aluminum of approximately 0.3 µm thick is formed as the gate line 15. Next, silicon nitride of approximately 0.3 to 0.5 µm thick is formed as the gate insulating film 22. Then, a conductive metal is provided as the conductive layer 41. The conductive layer 41 melts by laser application. A laser device is a YAG laser, for example. The conductive metal is formed by chromium, tantalum, titanium, aluminum, molybdenum, and the like. Its thickness is approximately 0.1 to 0.2 µm. Further, silicon nitride of approximately 0.1 µm is formed as the insulating film 45. Finally, the top layer of the pixel electrode 12 is formed by ITO of approximately 0.05 to 0.1 µm thick.

FIG. 4 shows a sectional view of the TFT area of the active matrix liquid crystal display device. As shown in FIG. 4, on the insulating substrate 11 such as a glass is formed the gate electrode 21. Then, the gate insulating film 22 is formed to cover the gate electrode 21. The silicon semiconductor layer 23 is formed thereon; then, on the middle thereof, the etching stopper 24 as a protective layer of a channel layer, and the insulating layer 45 are successively formed. The gate electrode 21 is formed by patterning a conductive film deposited by spattering in a photolithography process. The gate insulating film 22, the silicon semiconductor layer 23, and the etching stopper 24 are successively deposited by chemical vapor deposition (CVD), and patterned by the photolithography process.

Next, the first $n^+$ silicon film 25 and the second $n^+$ silicon film 26 are formed in isolation from each other. On the second $n^+$ silicon film 26 is formed the source electrode 27, the two electrically connected. On the first $n^+$ silicon film 25 is the drain electrode 14, electrically connected. The first $n^+$ silicon film 25 and the second $n^+$ silicon film 26 are formed by doping the silicon semiconductor layer 23 with impurities such as P and As. It is therefore possible to form the first $n^+$ silicon film 25 and the second $n^+$ silicon film 26 in the same step. The drain electrode 14 and the source electrode 27 are deposited by sputtering, and patterned by the photolithography process.

Then, the contact hole 30 is formed on the insulating film 45 to electrically connect the pixel electrode 12 and the drain electrode 14. The contact hole 30 is formed in the process of resist coating, exposure, development, etching, resist stripping, and so on. The pixel electrode 12 is formed thereon by depositing ITO by sputtering to have electrical connection with the drain electrode 14. The conductive layer 41 according to the present embodiment can be formed in the same layer as the drain electrode shown in FIG. 4. That is, in patterning the conductive layer to form the drain electrode 14 and the source electrode 27, the conductive layer is also left on the gate line 15 as the conductive layer 41. No additional step is therefore required to form the conductive layer 41. Similarly, the insulating layer 45 can be formed at the same time as forming the TFT 13.

Figure 3B:
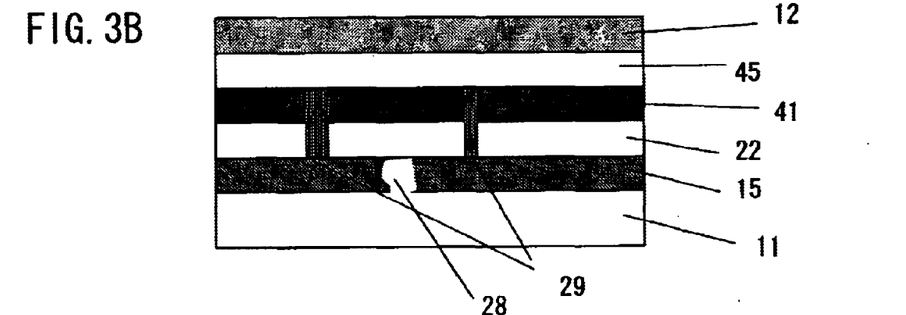

FIG. 3B shows a cross-section of the gate line 15 when a laser is applied to the square marks on both outsides of the disconnected portion 28 of the gate line 15 shown in FIG. 2. The laser is applied from the side of the gate line which is the side of the substrate 11 where the TFT 13 is not formed. The application of the laser to the marks melts the conductive layer 41 and the gate line 15 to produce the molten metal 29. A bypass route through the gate line 15, the molten metal 29, the conductive layer 41, the molten metal 29 and the gate line 15 is thereby created to let gate signals go through it, avoiding the disconnected portion 28. The disconnection is thereby repaired. Since the bypass route has no contact with the pixel electrode 12, the pixel electrode 12 serves as a shield so that gate signals going through the conductive layer 41 have no adverse effect on liquid crystals arranged on the pixel electrode 12. No error voltage is thereby applied to the pixel electrode 12 to be free from deterioration of display quality.

Figure 3C:
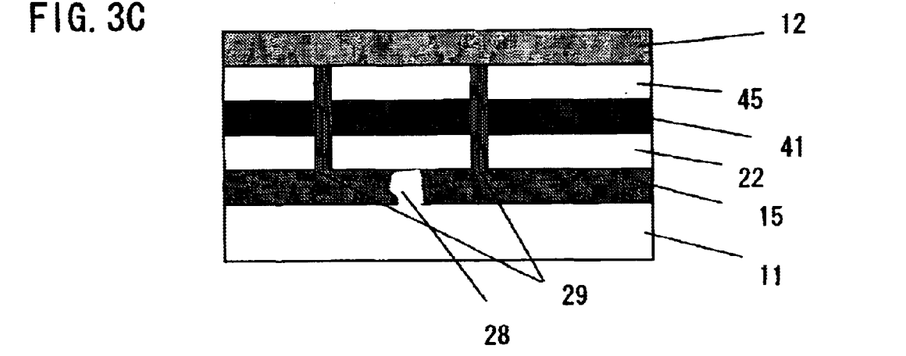

If a laser is applied from the side of the pixel electrode 12, on the other hand, electrical continuity is provided between the pixel electrode 12 and the gate line 15 as shown in FIG. 3C. Gate signals go through a bypass route through the gate line 15, the molten metal 29, the conductive layer 41, the molten metal 29, and the gate line 15, or through the gate line 15, the molten metal 29, the pixel electrode 12, the molten metal 29, and the gate line 15. The laser is applied to a cut line 50 shown in FIG. 2 to separate the pixel from the TFT 13. Though a point defect occurs at the subject pixel, the disconnection of the gate line 15 is repaired. No error voltage is thereby applied to the pixel electrode 12 to prevent deterioration of display quality.

The connection resistance of the molten metal 29 and the pixel electrode 12 is substantially the same as the connection resistance of the pixel electrode 12 and the drain electrode 14 through the contact hole 30 composed of the same material. Further, the electrical resistance can be kept within 100kΩ that is sufficient value for the repair, thus increasing the repair rate. The conductive layer 41 can be formed and patterned in the same layer as the source line 17 and the drain electrode 14. Therefore, the conductive layer 41 is formed by sputtering chromium, tantalum, titanium, aluminum, molybdenum, and the like. The conductive layer 41 has to lie over the disconnected portion 28, and therefore it is preferably as large as possible without contacting the source line 17 for a larger repairable area.

Second Embodiment

Figure 5:
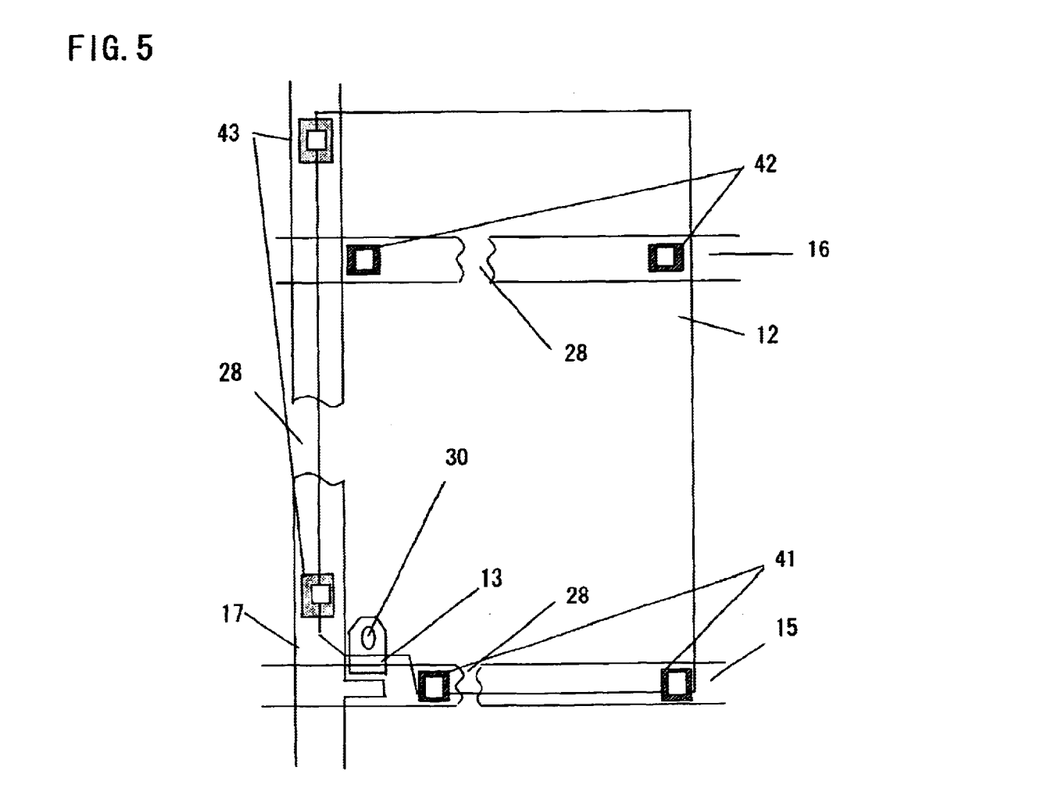
FIG. 5 is a plan view showing a structure of one pixel area of a liquid crystal display device according to the second embodiment of the present invention, where line disconnection occurs.
Figure 6:
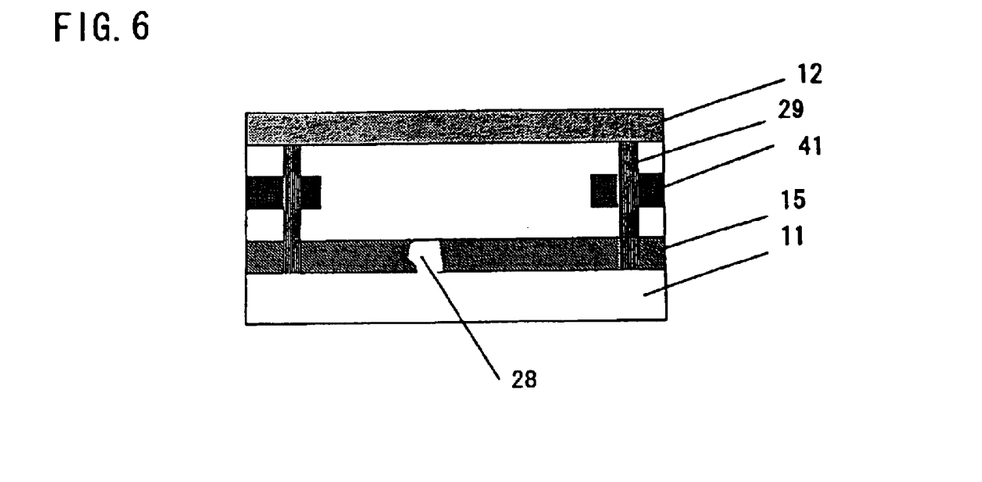
FIG. 6 is a sectional view showing a structure of a disconnected portion of a gate line in the liquid crystal display device according to the second embodiment of the present invention.

A method for repairing line disconnection according to the second embodiment of the present invention will be explained hereinbelow with reference to FIGS. 5 and 6. Like FIG. 1, FIG. 5 is a plan view showing a structure of one pixel area of an active matrix liquid crystal display device. FIG. 6 is a sectional view showing a structure of the portion where line disconnected is repaired. The same reference numerals as those in FIGS. 1 to 4 designate the same elements, and redundant description will be omitted. The description of the manufacturing process will be also omitted since it is the same as in the first embodiment.

Below the pixel electrode 12, a pair of the conductive layers 41, a pair of the conductive layers 42, and a pair of the conductive layers 43 are formed in an island shape above the gate line 15, the storage capacitor line 16, and the source line 17, respectively. The conductive layers are electrically floating. In the first embodiment, the conductive layer is provided in a possibly larger area on each of the three lines surrounding one pixel. In the second embodiment, on the other hand, each of the pair of the conductive layers is provided at each end of the three lines. The conductive layers above the gate line 15 and the storage capacitor line 16 can be formed in the same layer as the drain electrode 14 shown in FIG. 4 as with the case with the first embodiment. The conductive layers 41 and 42 have to avoid contact with the source line 17. The conductive layers on one line are preferably separated as far as possible to obtain a larger repairable area.

FIG. 6 shows a sectional view of the disconnected portion 28 of the gate line in the active matrix liquid crystal display device. The repair of the gate line 15 will be explained hereinbelow. Application of a laser to the conductive layer 41 from the pixel electrode 12 side or the insulating substrate 11 side produces the molten metal 29. It creates a bypass route through the gate line 15, the molten metal 29, the conductive layer 41, the molten metal 29, the pixel electrode 12, the molten metal 29, the conductive layer 41, the molten metal 29, and the gate line 15. Gate signals can thereby avoid the disconnected portion 28 and go through the bypass route. The line disconnection can be thus repaired.

The connection resistance of an aluminum element and ITO used for the pixel electrode 12 is extremely high. The repair of the gate line 15 in the conventional liquid crystal display device results in the cross-section structure shown in FIG. 8B in which the pixel electrode 12 and the gate line 15 have the direct contact. Therefore, when a laser is applied to connect them, the connection electrical resistance almost reaches one megohm, which is above the limit of the connection resistance for repairing disconnection. For the above reason, when repairing the disconnection as in FIG. 6, the conductive layer to produce the molten metal 29 is preferably formed by the material other than aluminum, such as chromium. The conductive layer can be formed in the same layer as the drain electrode 14 shown in FIG. 4. In order that the gate line 15 and ITO of the pixel electrode 12 are connected via the material such as chromium, tantalum, titanium, molybdenum to avoid direct contact, the source line 17 is formed by the above material, not aluminum. The connection resistance is thereby kept within 100KΩ that is substantially the same value as the connection resistance of the drain electrode 14 and the pixel electrode 12 through the contact hole 30. Therefore, disconnection of the gate line 15 formed by aluminum can be also repaired.

Other Embodiments

The method for repairing line disconnection and the structure therefor described in the above first and second embodiments are also applicable to the repair of disconnection of the source line 17 and the storage capacitor line 16. In the repair of disconnection of the source line 17, the conductive layer 43 can be formed in the same layer as the gate line 15; therefore, no extra manufacturing step is needed to maintain productivity. The conductive layer 43 is deposited by sputtering as with the case with the gate line 15. A laser is applied from the backside of the substrate 11 (the side where the TFT is not provided) to avoid contact between the pixel electrode 12 and the molten metal 29. The repair of the line disconnection is thereby attained without generating a point defect.

If the storage capacitor line 16 is provided between the gate lines 15 as shown in FIG. 1, the conductive layer 43 has to avoid electrical contact with the line 16. The conductible layer 43 is preferably as large as possible to enlarge the area where line disconnection can be repaired. If the storage capacitor line 16 is not provided, on the other hand, the conductive layer 43 has to avoid electrical contact with the adjoining gate line 15, while being as large as possible to obtain a larger repairable area. The conductive layer 43 can be formed between the source line 17 and the pixel electrode 12 with an insulating film interposed therebetween.

In the repair of the storage capacitor line 16, the conductive layer 42 can be formed in the same layer as the source line 17 as with the case with the gate line 15. No extra manufacturing step is therefore required. The conductive layer 42 has to avoid electrical contact with the adjoining source line 17. The conductive layer 42 is preferably as large as possible to obtain a larger repairable area.

If the repair results in direct contact between the conductive layer and the pixel electrode 12 and signals are directly applied to the pixel electrode 12, it is preferable to apply a laser to the cut line 50 on the TFT so as to separate the pixel from the TFT as shown in FIG. 2. Though a point defect is generated, the line disconnection is repaired. No error voltage is thereby applied to the pixel electrode 12 allowing no deterioration of display quality.

The present invention is particularly effective when applied to an active matrix liquid crystal display device in which a gate line and a source line cross each other with a gate insulating film therebetween. The present invention is also applicable to a liquid crystal display device further having a storage capacitor line parallel to the gate line. Further, the present invention can be applied to a liquid crystal display device of In-Plane-Switching (IPS) mode having comb-shaped electrode pairs comprised of a plurality of electrodes to apply an electric field horizontally causing liquid crystal molecules to rotate parallel to a substrate. Furthermore, the present invention can be applied to a display device other than a liquid crystal display device, having two kinds of lines crossing each other with an insulating film therebetween.

As explained in the foregoing, the present invention provides a display device capable of repairing line disconnection without decreasing display quality, and the repair method.

From the invention thus described, it will be obvious that the embodiments of the invention may be varied in many ways. Such variations are not to be regarded as a departure from the spirit and scope of the invention, and all such modifications as would be obvious to one skilled in the art are intended for inclusion within the scope of the following claims.

What is claimed is:

1. A display device having a plurality of pixels, comprising:
    a substrate;
    a gate line provided on the substrate;
    a first insulating layer provided on the gate line;
    a plurality of source lines at least partially overlapping the gate line with the first insulating layer interposed therebetween;
    a plurality of island-shaped conductors for repairing gate line disconnection, provided above the gate line with the first insulating layer interposed therebetween, the plurality of island-shaped conductors provided between and adjacent the source line;
    a switching element controlling a signal to a pixel;
    a second insulating layer with a through hole, provided on the switching element and the plurality of island-shaped conductors; and
    a pixel electrode provided above the switching element with the second insulating layer interposed therebetween and connected with the switching element via the through hole, the pixel electrode partially overlapping the plurality of island-shaped conductors.

2. A display device according to claim 1, wherein the plurality of island-shaped conductors are provided at both ends of the gate line in one pixel.

3. A display device according to claim 1, wherein the gate line disconnection is repaired by connecting the gate line and the pixel electrode via the plurality of the island-shaped conductors disposed at both ends of a disconnected portion of the gate line.

4. A display device according to claim 3, wherein the switching element is separated from the pixel electrode corresponding to the disconnected portion.

* * * * *